United States Patent
Yang et al.

(10) Patent No.: US 7,948,820 B2
(45) Date of Patent: May 24, 2011

(54) CIRCUIT PRE-CHARGE TO SENSE A MEMORY LINE

(75) Inventors: Tien-Chun Yang, San Jose, CA (US); Yonggang Wu, Santa Clara, CA (US); Nian Yang, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 692 days.

(21) Appl. No.: 11/951,262

(22) Filed: Dec. 5, 2007

(65) Prior Publication Data

US 2009/0147587 A1    Jun. 11, 2009

(51) Int. Cl.
*G11C 7/00*    (2006.01)

(52) U.S. Cl. .................................. 365/203; 365/185.25

(58) Field of Classification Search ............. 365/185.25, 365/203
See application file for complete search history.

(56) References Cited

U.S. PATENT DOCUMENTS

2008/0175062 A1 *    7/2008    Tran ......................... 365/185.21

* cited by examiner

*Primary Examiner* — Hoai V Ho
*Assistant Examiner* — Fernando N Hidalgo
(74) *Attorney, Agent, or Firm* — Turocy & Watson, LLP

(57) ABSTRACT

Commonly, read times of a memory line are slowed due to voltage overshoot and/or voltage undershoot. To eliminate these problems, a control component can manage voltage while a leakage component manages timing of voltage. This allows for a line pre-charge that produces increase read times. The control component can implement as a variable resistor that modifies value to compensate for temperature. The leakage component can include a capacitor configuration that allows voltage to pass.

20 Claims, 12 Drawing Sheets

CIRCUIT PRE-CHARGE TO SENSE A MEMORY LINE

TECHNICAL FIELD

Disclosed herein is information directed to memory access reads and in particular to pre-charging voltage on a line holding information.

BACKGROUND

Recent developments allow for storage of information in a digital format upon personal electronic devices. Storing information in a digital format typically includes holding individual bits of information as a high state or as a low state—however, other configurations are possible, such as implementation of fuzzy logic. This type of information storage permeates different applications including video record creation, interpersonal communication, television recording, as well as others. Various memory types exist to digitally store information and the memory types have distinguishing characteristics; different characteristics make them applicable for different types of applications. For example, a memory type that has a characteristic of re-writeability can be beneficial for temporary storage. This provides a beneficial economic situation, since memory can be re-used as opposed to replaced.

One specific development is the introduction of flash memory technology; flash memory is a memory type that is readable, re-writeable, and non-volatile. In addition, many flash memory devices are small and portable, thus enhancing usability. This allows for usage of flash memory in an array of personal applications, such as storage in a cellular telephone to a portable unit with a Universal Serial Bus connection. A common flash memory device can be accessed by an array of different electronic devices, where electronic devices likely read information stored on flash memory device. The ability to re-write to flash memory allows a user to use the memory as temporary storage location. For example, a user can store a photograph in a flash memory device and transfer the photograph to a desktop computer. Once the transfer is complete, the user can store to cells that were previously used in the flash memory. In addition, flash memory is easily transportable since it does not need a constant source of power to retain data.

SUMMARY

The following discloses a simplified summary of the specification in order to provide a basic understanding of some aspects of the specification. This summary is not an extensive overview of the specification. It is intended to neither identify key or critical elements of the specification nor delineate the scope of the specification. Its sole purpose is to disclose some concepts of the specification in a simplified form as a prelude to the more detailed description that is disclosed later.

Conventional reads of memory stored upon a memory line (e.g., a line that holds digital information, commonly made of metal) take a relatively long time since the memory line is commonly not pre-charged. In order for the memory line to be read, the memory line is first charged to a stabilized level and then read. Adding an initial voltage application can create an overshoot and a flash memory device waits for the voltage to reach a suitable range before a read begins. The disclosed innovation pre-charges the memory line and retains the voltage in a desirable range. This can assist in eliminating both undershoot and overshoot, which produces faster read times.

The following description and the annexed drawings set forth certain illustrative aspects of the specification. These aspects are indicative, however, of but a few of the various ways in which the principles of the specification can be employed. Other advantages and novel features of the specification will become apparent from the following detailed description of the specification when considered in conjunction with the drawings.

DETAILED DESCRIPTION

Figure 1:
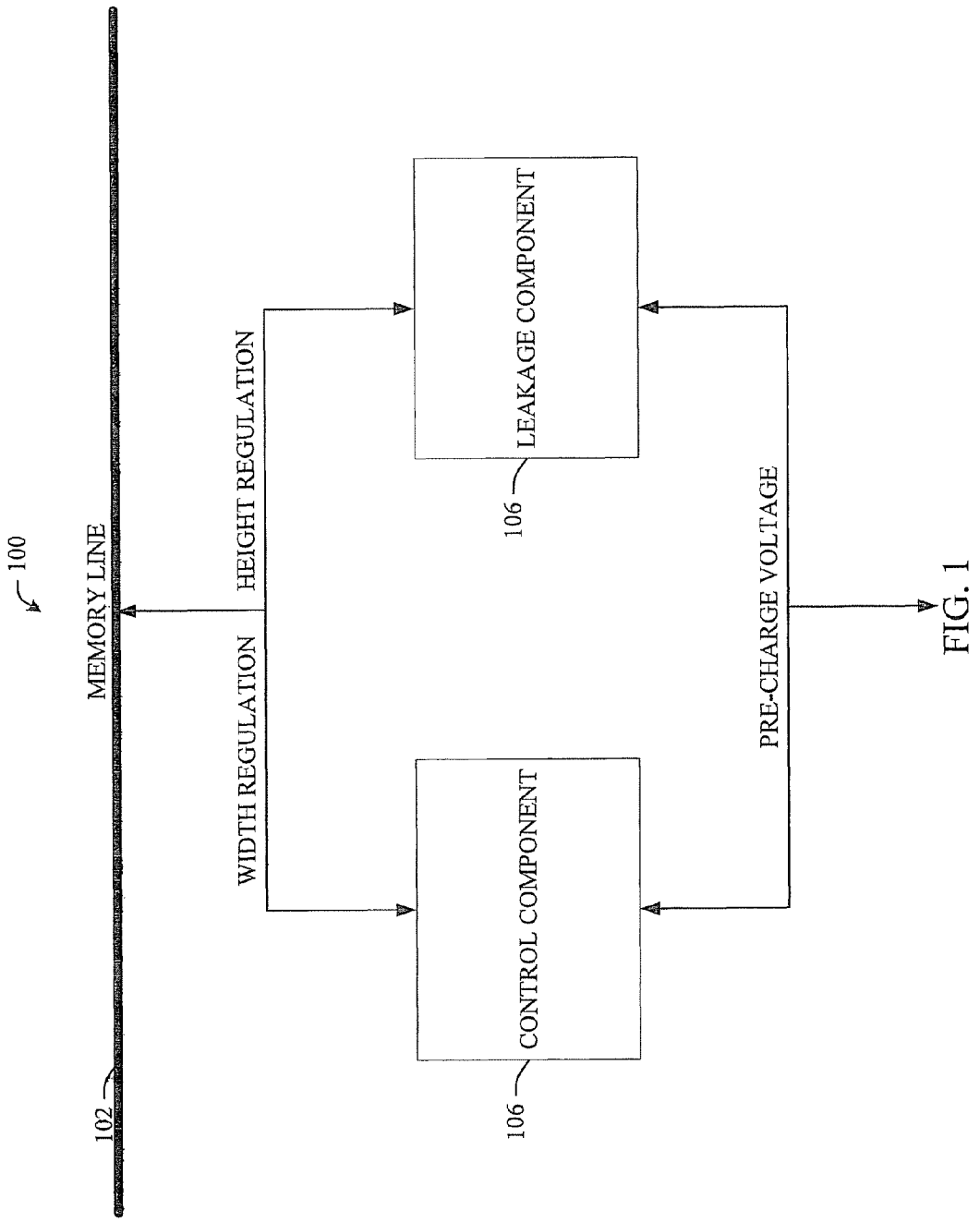
FIG. 1 illustrates a representative pre-charge pulse regulation system in accordance with an aspect of the disclosed innovation.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It can be evident, however, that the claimed subject matter can be practiced without these specific details. In other instances, well-known structures and devices are shown in block diagram form in order to facilitate describing the claimed subject matter.

FIG. 1 discloses an example system 100 for placing a pre-charge voltage upon a memory line 102 (e.g., a datab line), commonly implemented upon a flash memory device. In conventional operation, a voltage is applied to the memory line in order to read stored data—commonly, the voltage originates from a cascade circuit designed to apply an appropriate read voltage. The memory line can have a desirable voltage and/or desirable voltage range that enables reading; for instance, the memory line can charge to a value of about 1.4 Volts (V) before the memory line can be read. At read time, a cascade voltage is applied to the memory line, the memory line charges to the desired voltage, and then the memory line is read. Since it takes time to charge the memory line to the desirable value, read times are slower and overall flash memory performance suffers.

A voltage can be pre-charged in anticipation of application to the memory line, thus resulting in faster read times since the memory line can be at a desired voltage more quickly. However, mere utilization of a pre-charge voltage can lead to voltage overshoot and/or voltage undershoot. If not enough voltage is applied, then the pre-charge voltage level can still wait to reach the desirable value, thus resulting in a long read time. In a converse situation, too much voltage can be initially charged, which can cause voltage overshoot. If voltage reaches too high of a level, then damage can be caused to flash memory; therefore, the cascade circuit waits for the voltage level to before application upon the memory line.

The disclosed innovation operates to correct both voltage overshoot and voltage undershoot of a pre-charge voltage. A control component 104 regulates a pulse width within a specified range, where the width determines time of a pre-charge pulse. Common pre-charge voltages operate as damped oscillators—the voltage has a response that fades away over time as a sine wave in an exponential decay envelope. The control component 104 allows the pre-charge to last long enough that voltage reaches a desired amount.

The control component 104 can be a variable resistor that adjusts a resistance level to regulate the pulse width. The variable resistor adjusts the resistance level as a function of temperature and the adjustments allow the pulse width to remain the specified range. As temperature increases, the pulse width can become longer—the control component 104 can alter resistance to compensate for the increased width and respond conversely if temperature decreases.

A leakage component 106 governs a pulse height interior of a specified range, where pulse height determines pre-charge voltage level. Governing the pulse height keeps the height within the range, thus holding the pulse in check. The pulse width and pulse height are of a pre-charge voltage of a memory line 102. The leakage component 106 governs pulse height through voltage removal—voltage can be leaked at a rate that allows the pre-charge voltage to remain in a desired level and/or common leaks can be eliminated to retain voltage at a desirable level. Working in combination, the control component 104 and the leakage component 106 create a desirable pre-charge voltage that leads to read times that are faster. It is to be appreciated that the control component 104 and/or leakage component 106 can integrate with a flash memory device, function upon a flash memory device while being independent of the flash memory device, as well as operate in other configurations.

Figure 2:
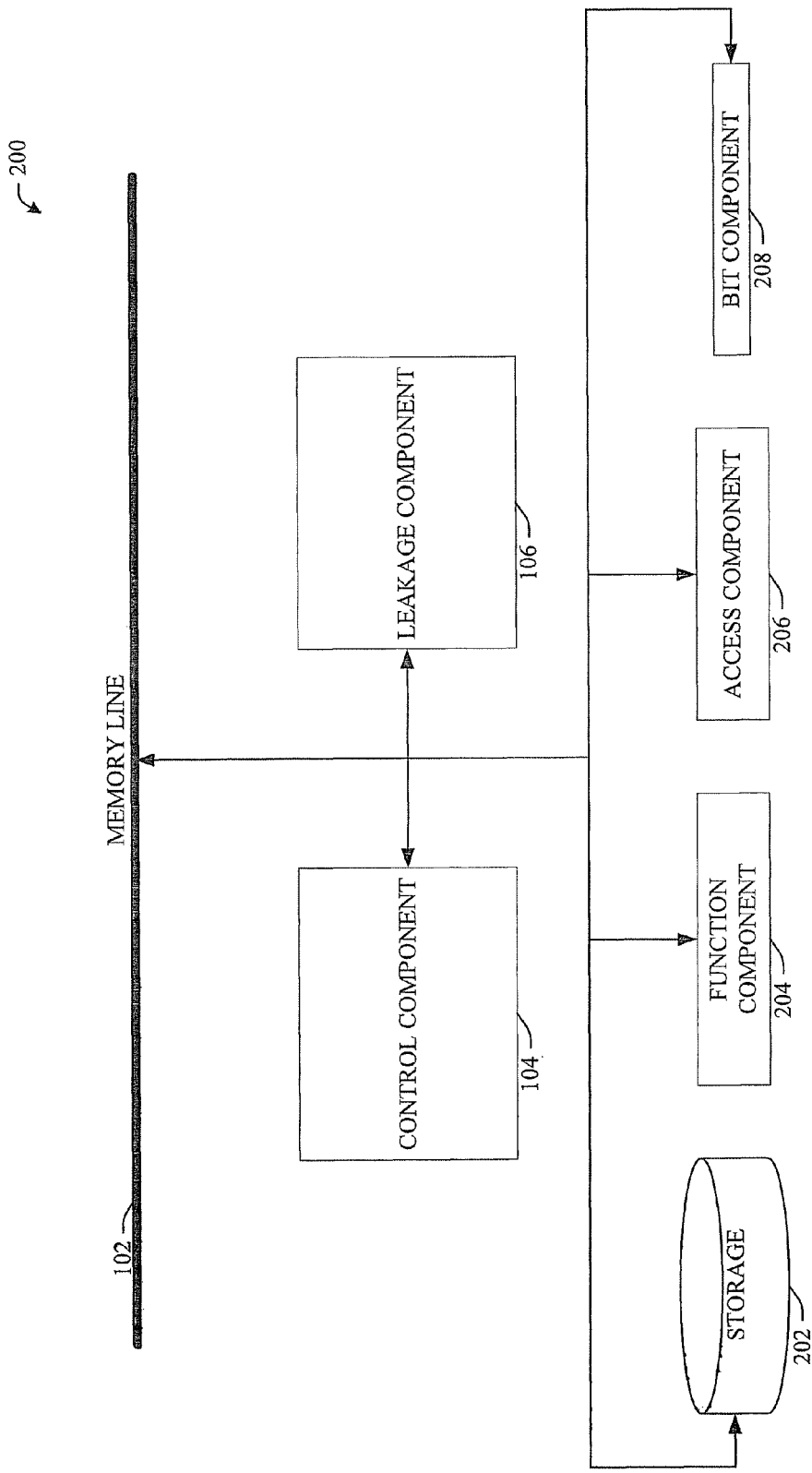
FIG. 2 illustrates a representative pre-charge pulse regulation system with supplemental components in accordance with an aspect of the disclosed innovation.

FIG. 2 discloses an example system 200 for performing a read operation upon a memory line 102, commonly implemented upon flash memory. A control component 104 regulates a pulse width within a specified range. A leakage component 106 governs a pulse height interior of a particular assortment. The pulse width and pulse height disclose a pre-charge voltage of the memory line 102. Additional components can integrate upon the system 200 to create greater functionality concerning reading the memory line 102.

Storage 202 can retain information that is useful in reading the memory line 102. For example, the storage 202 can hold an index of where different information sets are located upon the flash memory. Different word processing documents can be held on the flash memory; the memory line 102 holds data relating to a specific document. The storage 202 can be implemented in various configurations, including random access memory, read-only memory, magnetic take, hard disk, flash memory, etc.

A function component 204 produces the pre-charge voltage that is altered by the control component 108 and/or the leakage component 106. According to one embodiment, the function component 204 produces a constant voltage and modifications take place through the control component 104 and/or leakage component 106. However, the function component 204 can adaptively learn (e.g., through artificial intelligence techniques) how voltage is being changed and alter produced voltage.

Artificial intelligence can employ one of numerous methodologies for learning from data and then drawing inferences and/or making determinations related to applying a service (e.g., Hidden Markov Models (HMMs) and related prototypical dependency models, more general probabilistic graphical models, such as Bayesian networks, e.g., created by structure search using a Bayesian model score or approximation, linear classifiers, such as support vector machines (SVMs), non-linear classifiers, such as methods referred to as "neural network" methodologies, fuzzy logic methodologies, and other approaches that perform data fusion, etc.) in accordance with implementing various automated aspects described herein. Methods also include methods for the capture of logical relationships such as theorem provers or more heuristic rule-based expert systems.

An access component 206 reads the memory line 102 when the pulse width and pulse height align in an appropriate configuration. A pre-charge voltage is created so if a read is to take place, voltage is at an appropriate level that will yield a fast read time. Various regulatory components can integrate with the access component 206, such as an emergency component that stops voltage if damage is being caused or a determination component that evaluates when the read is complete and stops operation of the access component 206.

A bit component 208 organizes the voltage pulse into a bit level. Information can be stored in dual-bit configurations, quad-bid configurations, octa-bit configurations, etc. Commonly, multi-bit configurations have stacked voltages, such as about 0.25 V—about 0.5 V for '00', about 0.51 V—about 0.75 V for '01', about 0.76 V to about 1 V for '10', and above about 1 V for '11'. If too severe of an overshoot takes place, then there can be confusion over a value of the memory line 102. The bit component 208 ensures that voltage does not spike or undershoot in such a manner that an incorrect reading is produced.

Figure 3:
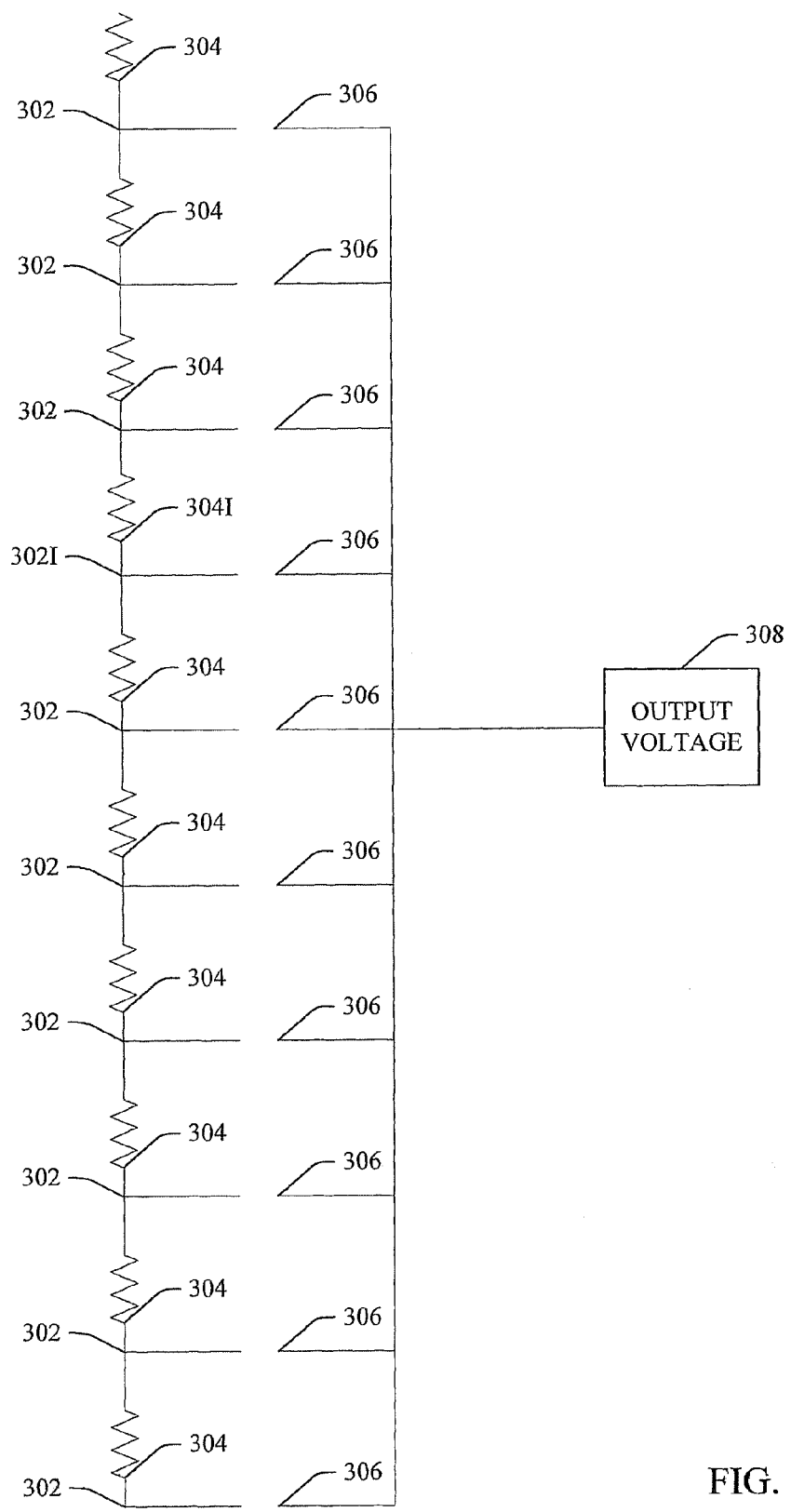
FIG. 3 illustrates a representative control component in accordance with an aspect of the disclosed innovation.

FIG. 3 is an example control component 104 implemented as a variable resistor. A relatively large number of nodes 302 and resistors 304 can interconnect. The typical resistor used in this configuration has a width of about 1.6 microns with a resistance of about 1500 Ohms. Additionally, the resistors can each be of different values. Nodes 302 include a voltage drop that charges from zero to Vcc as a function of time. However, due to their series arrangement, the resistors each charge at a different speed. Connections are shown as an open circuit 306. However, as a node 302 charges to Vcc, the open circuits close and current passes through. When nodes reach the level of Vcc, an output voltage 308 is produced.

One specific resistor 302I, node 304I and open circuit 306I is specifically designated to show the functionality of the control component 104; these components are the fourth element from the top of the drawing. When the other elements in the control component 104 are at the proper states, current flows through the resistors 304. At a specific time, the voltage drop over the resistor 304I is Vcc. The node after the resistor 304I then contains Vcc and the open connection 306I closes so current can travel across. After a length of time (e.g., time for voltage to pass), there is no longer a voltage drop associated with the node 304I. When there is no longer a voltage drop at the node 304I, the connection 306I returns to an open state. The entire process starts again and the node 304I gains a voltage drop approaching Vcc.

This configuration has specific properties that relate to the temperature of the resistors. This is because the typical system configuration is with resistors that possess positive temperature coefficients. The types of resistors that are typically used are high voltage n-well resistors (HVNW resistors). Positive temperature coefficient resistors are typically made from polyethylene and graphite or from titanate ceramic. If there is a hotter temperature, then the pulse width is larger and the signal strength becomes stronger. If there is stronger signal strength for a single pulse, then there is more stability for the operation. The disclosed configuration increases the temperature of the resistors and therefore creates a more stable operation.

Figure 4:
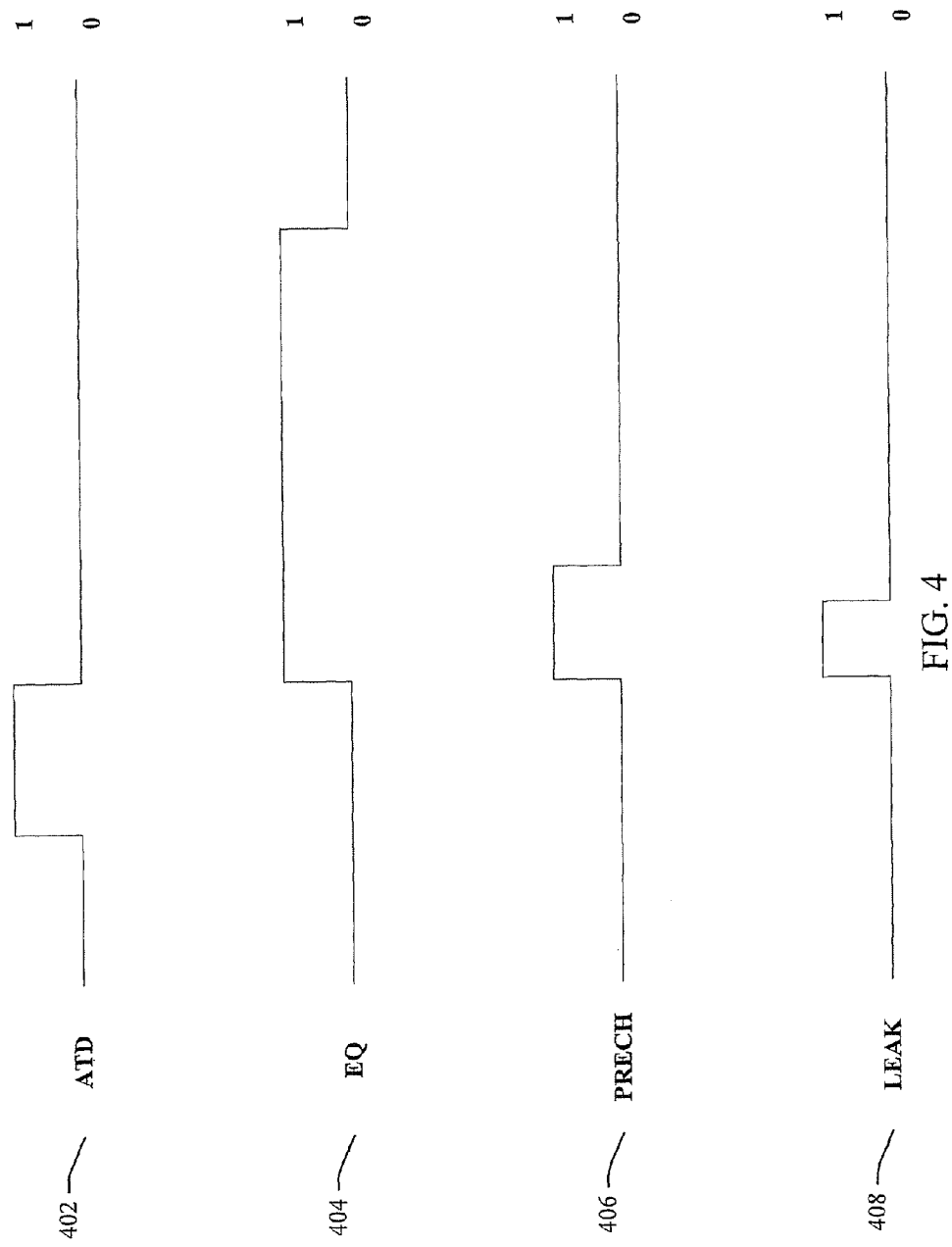
FIG. 4 illustrates representative logical sequences in accordance with an aspect of the disclosed innovation.

FIG. 4 is an exemplary representation of the timing functions taking place with the cascade circuit. The ATD function 402 decodes a core cell operating in conjunction with a flash memory device implementing the system 100 of FIG. 1. The EQ function 404 represents an amount of time necessary to turn on bitlines and wordlines in a memory array that holds the memory line 102 of FIG. 1. The PRECH function 406 assists in creating a stable voltage in a cascade circuit. The LEAK function 408 is the operation function of the leak component 106. As can be seen in the drawing, the LEAK function 408, the PRECH function 406, and the EQ function 404 do not change to a '1' state until the ATD function returns to a '0' state. The four functions 402-408 should be viewed in synchronization.

Figure 5:
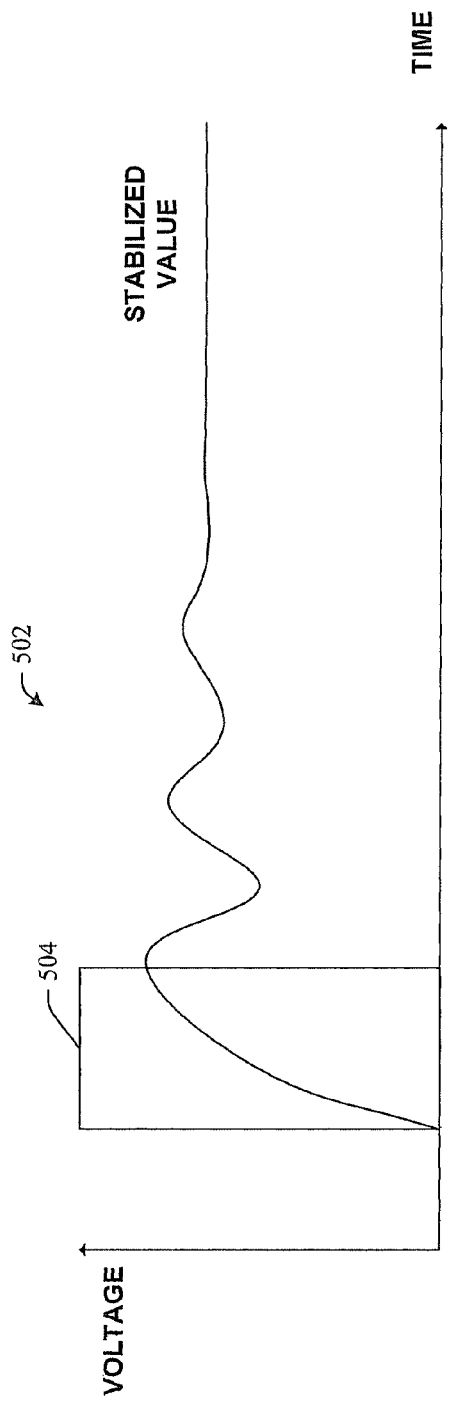
FIG. 5 illustrates a representative overshoot occurrence in accordance with an aspect of the disclosed innovation.

FIG. 5 is an exemplary representation 502 of pre-charging in a common overshoot situation. The voltage changes as a function of time; the highest point of the voltage is well above the ultimate stabilized value. If a pre-charge pulse 504 ends when the voltage is at its highest, the voltage is clearly higher than the stabilized value; therefore, there is voltage overshoot. Time is wasted bringing the voltage down to the stabilized value.

Figure 6:
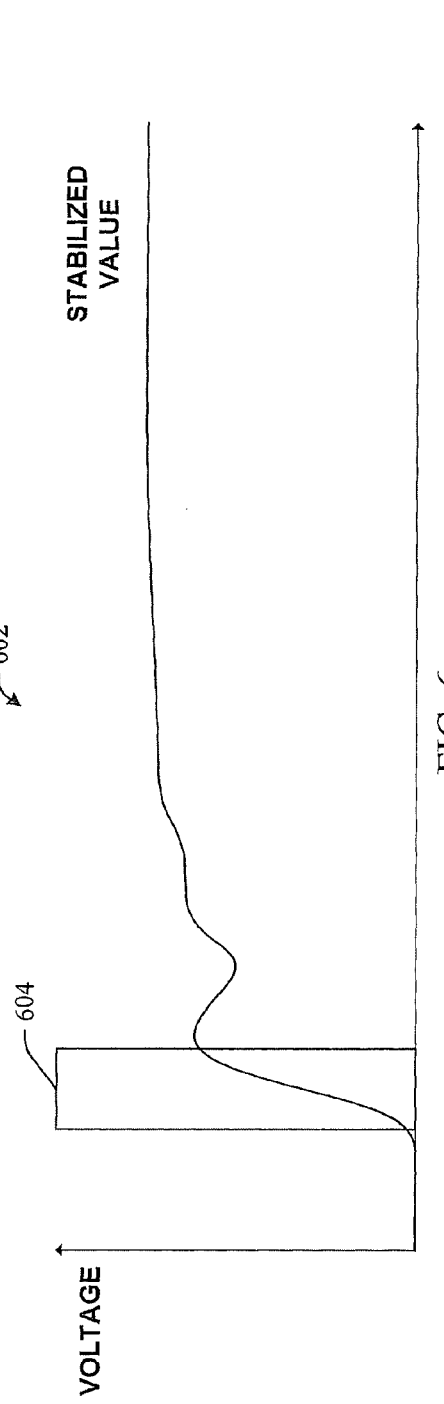
FIG. 6 illustrates a representative undershoot occurrence in accordance with an aspect of the disclosed innovation.

FIG. 6 is an example representation 602 of pre-charging in a conventional undershoot situation. As in FIG. 5, the voltage changes as a function of time and the voltage drops down before it reaches the stabilized value. Time is wasted bringing the voltage up to a stabilized value. While FIG. 5 and FIG. 6 disclose overshoot and undershoot problems as a result of difficulties with pulse width, similar problems can occur related to pulse height.

Figure 7:
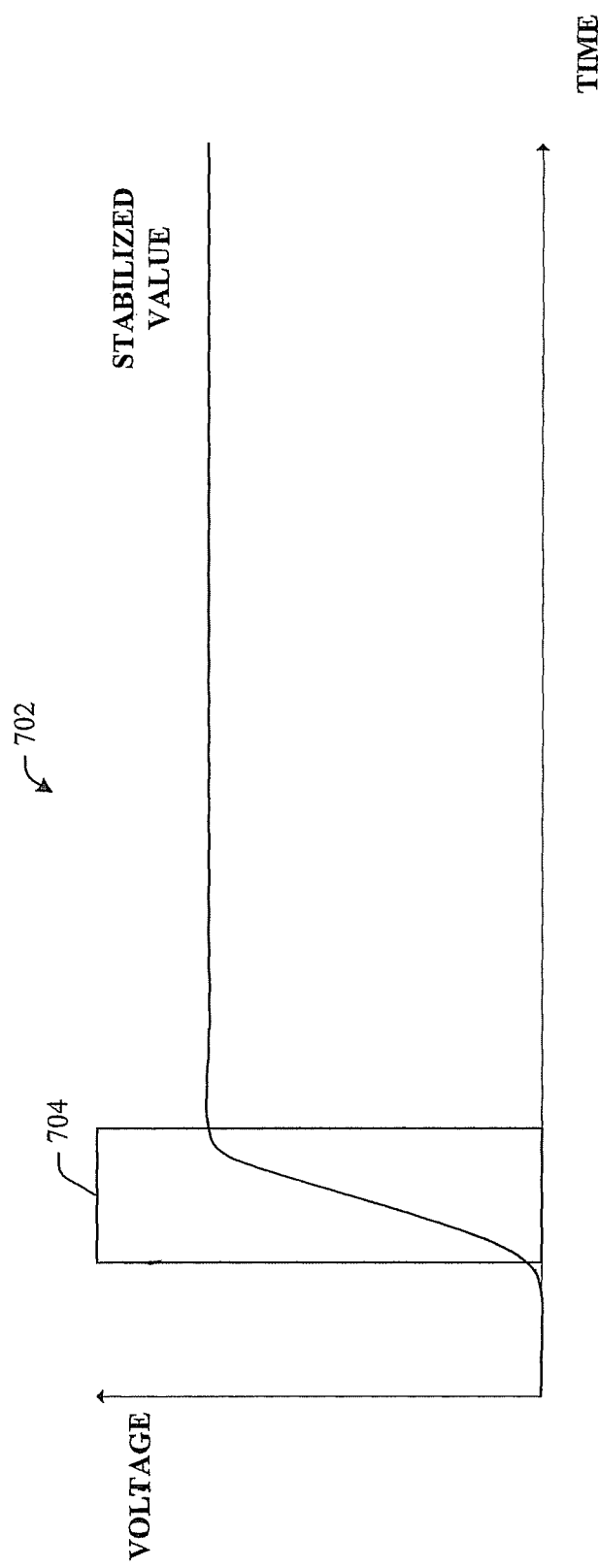
FIG. 7 illustrates a representative modified voltage in accordance with an aspect of the disclosed innovation.

FIG. 7 is an exemplary representation 702 of model pre-charging through implementation of the control component 104 of FIG. 1 and the leakage component 106 of FIG. 1. As discussed with FIG. 5 and FIG. 6, the voltage changes as a function of time. At the end of a pre-charging pulse 704, the voltage has reaches the level near its stabilized value. There are possibilities for some variation on the precision of the functionality of the circuit since perfect results can be difficult to obtain. For example, the target voltage may be a voltage range, such as from about 1.2V to about 1.4V. This specification allows the stabilized voltage to hit within the range. However, there may be such precision in a design that the voltage needed must be a specific voltage, such as about 1.3V, therefore making it so the ends of the voltage range are substantially equal to one another.

Figure 8:
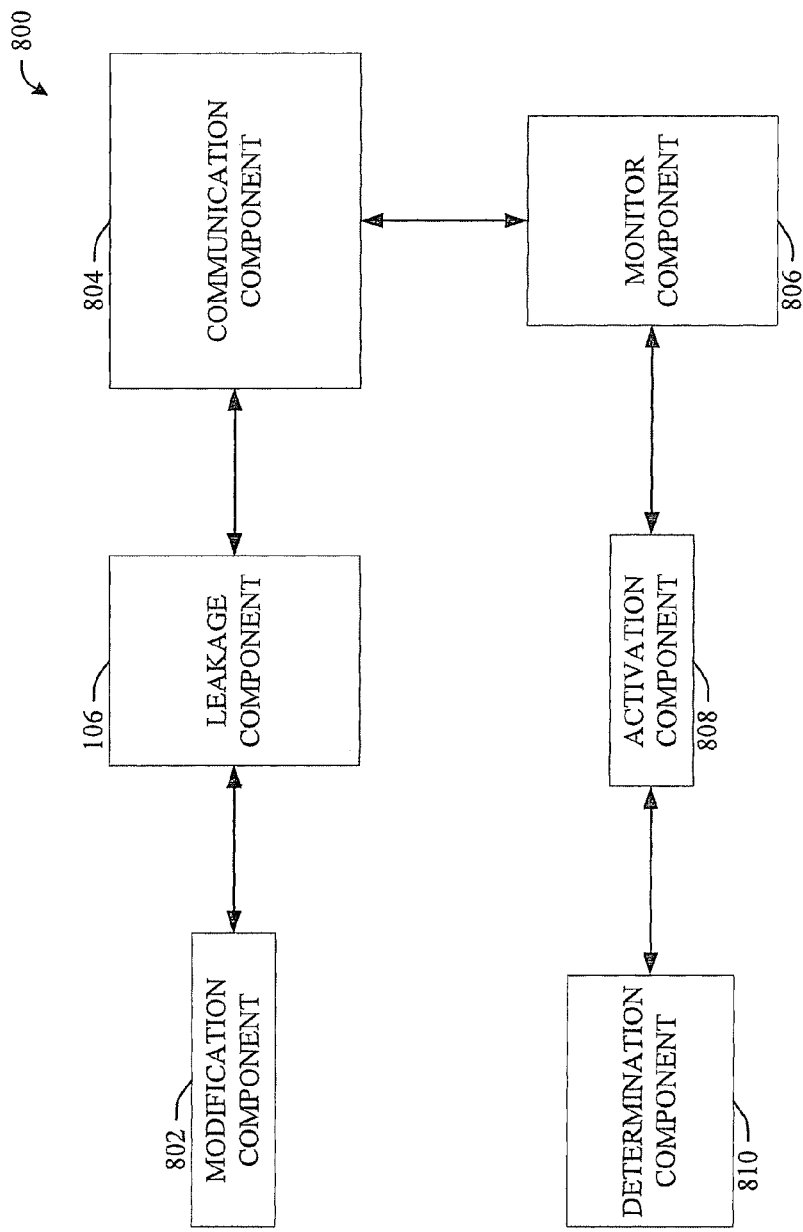
FIG. 8 illustrates a representative overshoot and undershoot correction system in accordance with an aspect of the disclosed innovation.

FIG. 8 discloses an example system 800 for practicing aspects disclosed herein. A modification component 802 alters parameters of a variable resistor to compensate for temperature changes. The modification component 802 can operate as a means for modifying a value of a variable resistor upon application of a voltage to a pre-charge circuit as a function of temperature.

A leakage component 106 governs a pulse height interior of a specified range. Various capabilities of the leakage component 106 are discussed throughout the detail disclosure, summary, abstract, etc. The leakage component 106 can be practiced according to various implementations, such as a capacitor, a capacitor/resistor configuration, etc. The leakage component 106 can operate as a means for enabling at least part of the voltage to pass.

A communication component 804 allows the system 800 and/or a flash memory device operating the system 800 to communicate with other device. The communication component 804 can operate wirelessly, in a wired manner, etc. In addition, temporary connections can be established with an auxiliary device, such as a personal computer. The communication component 804 can configure as a means for collecting a command to read voltage, modifying the value or enabling at least part of the voltage to pass take place as a result of command collection. The communication component 804 can additionally operate as a means for transmitting results of the metal line read to an auxiliary location.

A monitor component 806 tracks voltage of the pre-charge circuit. The monitor component 806 can function as an ammeter, ohmmeter, heat-sensor, etc. The monitor component 806 can transfer tracked results to the leakage component 106, modification component 802, control component 104 of FIG. 1, etc. and there can be altered operation based upon the results. The monitor component can function as a means for monitoring a voltage level of the pre-charge circuit.

An activation component 808 initiates a read upon the memory line 102 of FIG. 1; commonly through supplying power to a cascade circuit. In addition, the activation component 808 can supply power to a pre-charge circuit. When a read is complete and/or a successful determination is made on a value of the memory line 102 of FIG. 1, the activation component 808 can power down the cascade circuit. Also, when pre-charge is complete, no longer necessary, etc., the activation component can shut down the pre-charge circuit. The activation component 808 can configure as a means for activating a circuit to read a metal line holding data, activation takes place when the pre-charge circuit reaches a specified range.

A determination component 810 evaluates a read to determine a value held by the memory line 102 of FIG. 1. Commonly, a value of the memory line 102 of FIG. 1 is multi-bit and this can be read by the determination component 810. The determination component 810 can implement as a means for determining a multi-bit value of the metal line holding data.

Figure 9:
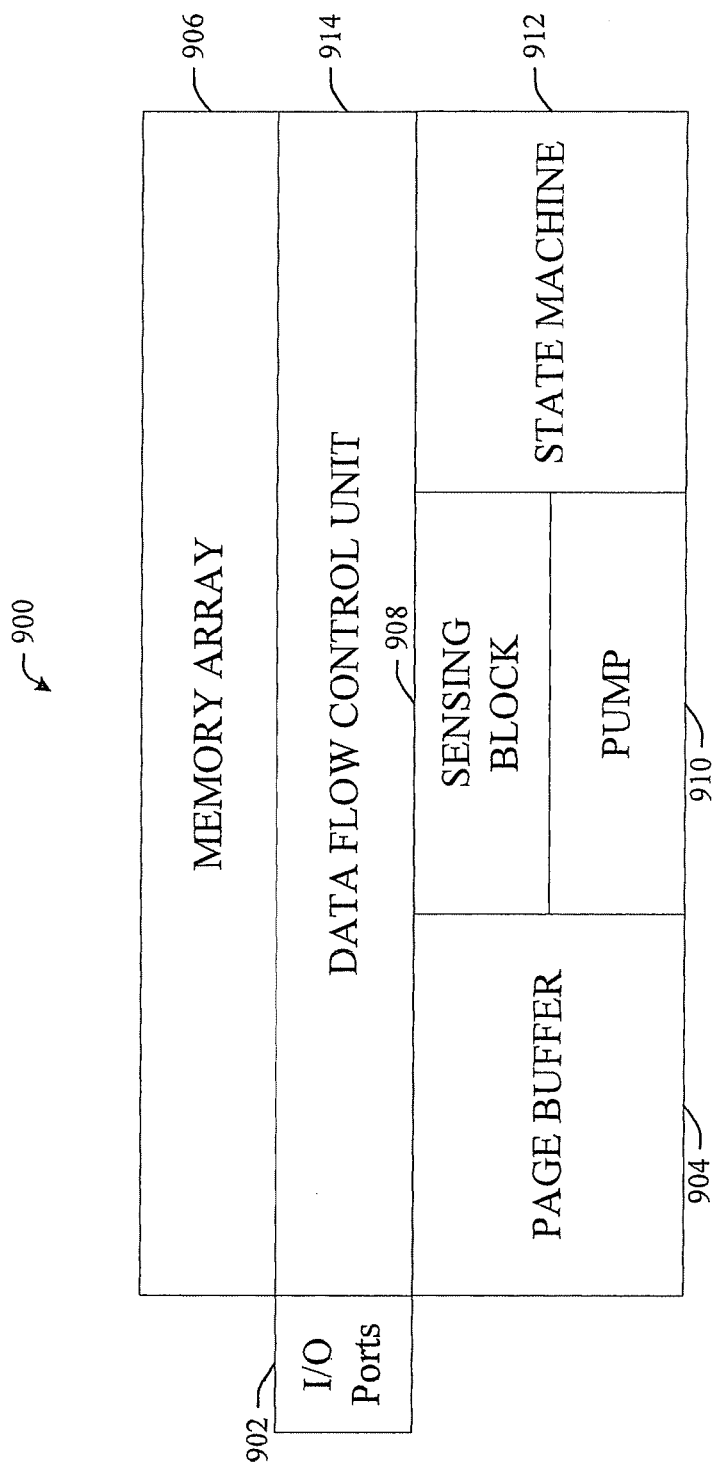
FIG. 9 illustrates a representative flash memory device in accordance with an aspect of the disclosed innovation.

FIG. 9 illustrates an example flash memory device 900 with components that can integrate with information disclosed in other portions of the disclosure. A flash memory device 900 has I/O ports 902 that connect to an auxiliary device (e.g., a personal digital assistant). The I/O port 902 communicates with the auxiliary device digitally, which allows the information to be communicated as a set of high/low states. This I/O port 902 can have a several configurations; for example, configurations can include individual metal prongs or a universal serial bus (USB) port. Another function of the I/O port 902 is that it can provide power to the flash memory device by drawing power from the auxiliary device in which it connects. The I/O port 902 can operate in conjunction with the communication component 804 of FIG. 8.

A page buffer 904 is a temporary holding place for information. The page buffer 904 can function during the mapping of the information when retrieved from storage. For example, when accessing a look-up table to determine a memory line to read, table information can be mapped into a page buffer. A common page buffer 904 employs static random access memory (SRAM). In many flash memory devices 900, there is a plurality of page buffers 904 including at least one scratch-pad buffer that performs temporary storage A memory array 906 is a storage location for a flash memory device 900; that can include the memory line 102 of FIG. 1. Typically, a memory array 906 comprises a number of individual cell components that can contain information in bits, with typical cells holding one to eight bits for information. In one embodiment, various storage discussed in the disclosure integrates into the memory array 906 (e.g., storage 202). In another embodiment, storage discussed in the disclosure is independent of the memory array 906.

A sensing block 908 functions to monitor overall operations within the flash memory device 900. For example, a sensing block 908 can determine is a page buffer 904 is free before a component sends information to that specific page buffer 904. The sensing block can sense how much information is in a page buffer 'A' before sending information to a page buffer 'B'. A pump 910 provides a high voltage for operations that require such a voltage. For example, some erasing functions require a relatively high level of voltage for proper operation. The pump can supply a Vcc that is used to produce a pre-charge voltage, read voltage, etc. A state machine 912 provides logic functions to the flash memory device 900. For example, some components run at certain states; example operations of the state machine 912 can be viewed in FIG. 4. While the state machine 912 provides a high state, some components are on while others are off and the opposite for a low state.

A data flow control unit 914 controls many major functions of the flash memory device 900. Functions generally includes writes, reads and erases, as well as several of the functions performed by components of the disclosure. For example, the voltage application component 106 can integrate with the data flow control unit 914 to allow for state changes. The data flow control unit can hold the control component 104 of FIG. 1 or the leakage component 106 of FIG. 1.

Figure 10:
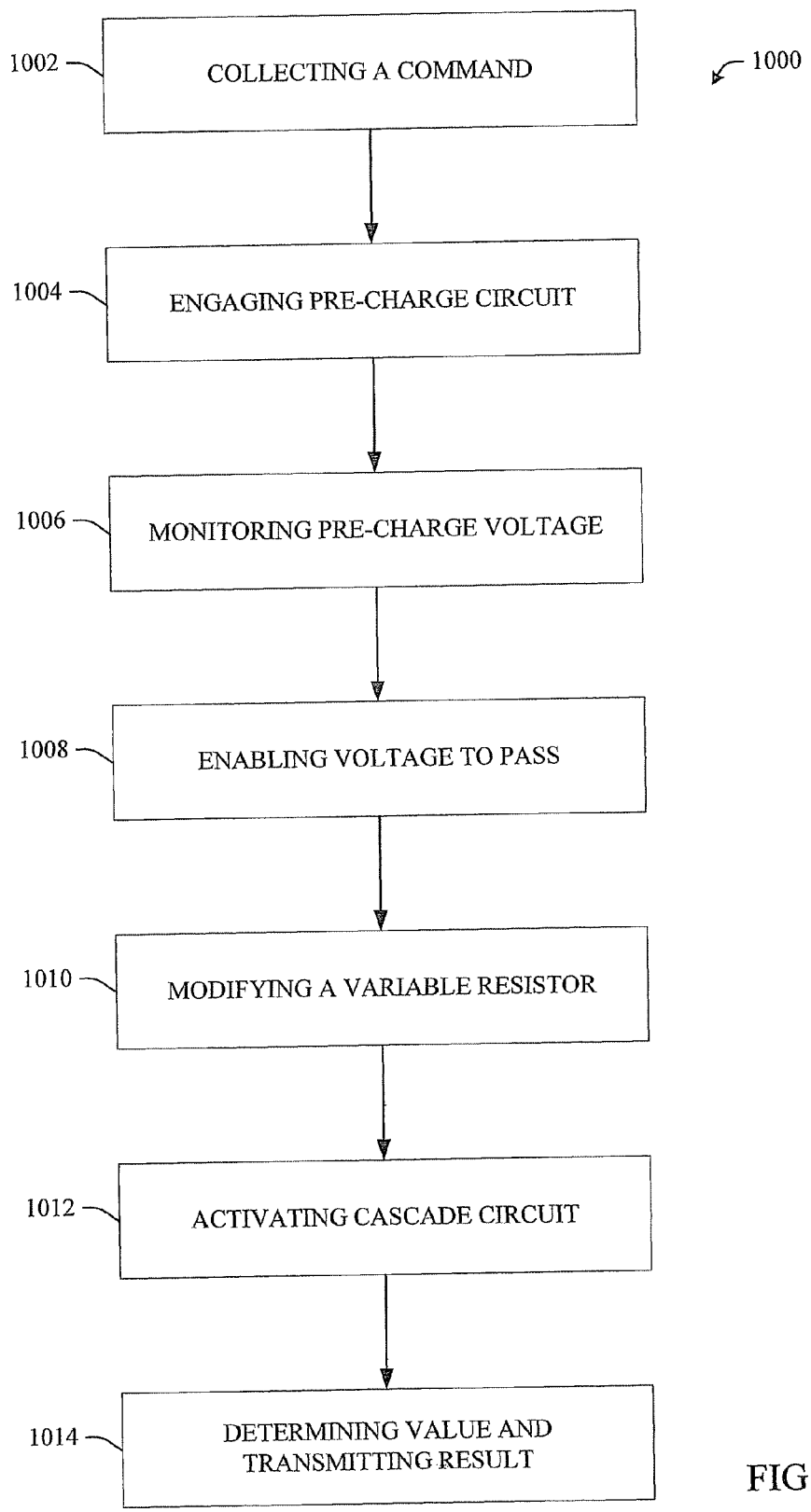
FIG. 10 discloses a representative methodology for reading a memory line though use of a pre-charge voltage in accordance with an aspect of the disclosed innovation.

FIG. 10 is an example methodology 1000 for operating a memory line read using a pre-charge voltage. At event 1002, collecting a command to read voltage is commonly obtained from an auxiliary device, such as a personal computer. Modifying a value of a variable resistor or enabling at least part of a voltage to pass takes place as a result of command collection.

Engaging the pre-charge circuit supplies an adequate amount of power for a pre-charge voltage to be utilized in reading a memory line 1004. Monitoring a voltage level of the pre-charge circuit allows for modification of a variable resistor to control pulse width and for manipulation of pulse depth 1006.

Enabling at least part of the voltage to pass can keep a pre-charging voltage in a desirable range 1008. Commonly this includes initializing a leakage component, but also altering parameters so different amounts of voltage are able to pass. In order to alter the parameters correctly, there can be reviewed monitor results as well as using a created history.

Modifying a value of a variable resistor upon application of a voltage to a pre-charge circuit as a function of temperature allows for pulse width to be kept in a desirable range 1010. The variable resistor can be a single resistor that is capable of be altered, a grouping of multiple resistors into a single configuration, etc. Operation of actions 1010 and 1008 allows for reduction of overshoot and/or undershoot to a stabilized voltage.

Activating a cascade circuit to read a metal line holding data, activation takes place when the pre-charge circuit reaches a specified range 1012; where the cascade circuit performs a read upon a memory line. Activating can include supplying power to a cascade circuit, powering at least one capacitor, etc. Activation can include de-activating the cascade circuit when a read is complete Determining a multi-bit value of the metal line holding data occurs and then transmitting results of the metal line read to an auxiliary location 1014. Commonly, multiple bits can convey information and event 1014 allows multiple bit information to be determined. Transmission can include transferring read information to an auxiliary device, such as a personal computer in which a flash memory running the methodology 1000 connects. However, other implementations include transmission to a supplemental device, into internal storage, through wireless communication, etc.

Figure 11:
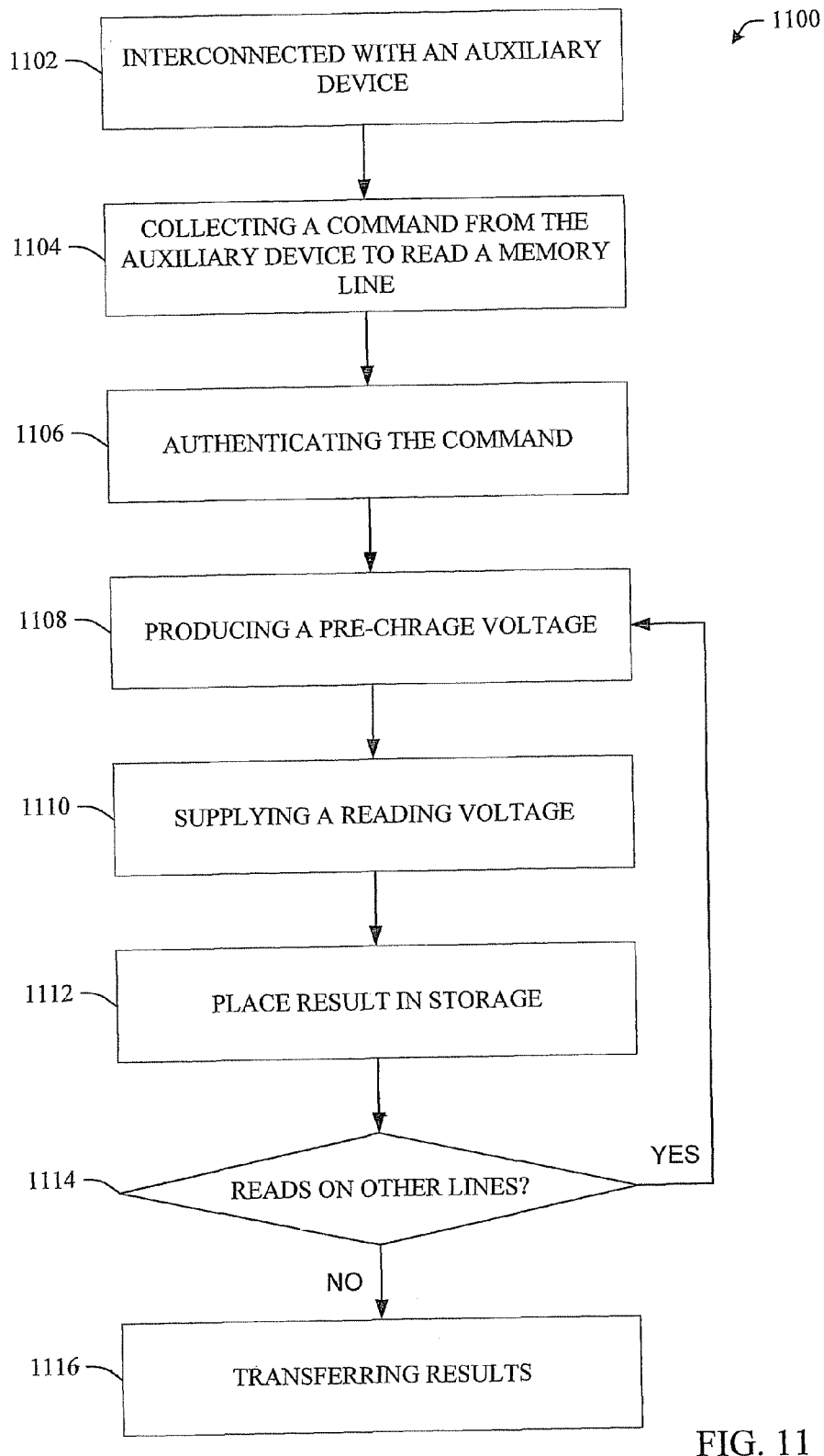
FIG. 11 discloses a representative methodology for flash memory communication in accordance with an aspect of the disclosed innovation.

FIG. 11 discloses an example methodology 1100 for reading a memory line of a flash memory device. Interconnection can take place between the flash memory device and an auxiliary device 1102, such as a cellular telephone, personal digital assistant, etc. The interconnection can include a physical coupling, electronic coupling, etc. where information can be shared between the flash memory device and the auxiliary device. According to one embodiment, the flash memory device can physically separate from the auxiliary device in a portable manner.

A command is collected from the auxiliary device to perform a read upon a section of memory 1104. The command can originate from a variety of places and situations, such as from a user request or through an automatic operation of an auxiliary device. However, the command can originate from a supplemental device, such as a database in communication with the auxiliary device.

A command can be authenticated to ensure that a requested read should take place 1106. Information held on a memory line (e.g., held on a plurality of memory lines) can be valuable and intended to be known by limited parties. Authentication can ensure that a proper party is making a request to perform a read (e.g., though review of an Internet Protocol address).

Production of a pre-charge voltage 1108 allows faster read times to take place upon the memory line. Production can include supplying the voltage as well as regulating the voltage. Regulation can take place through modifying a pulse width and/or pulse height of the pre-charge voltage. Event 1108 can be performed through the control component 104 of FIG. 1 and/or leakage component 106 of FIG. 1.

Supplying of a reading voltage allows determining a value upon the memory line 1110. The supplied reading voltage can be constructed off the pre-charge voltage so operation can take place quicker. Various safeguards can be implemented such that damage does not occur upon the memory line. For instance, if voltage becomes too high, then an automatic stop can take place.

The result can be placed in storage 1112 that allows other results to be combined. A common read request does not want information held on one line, but on a plurality of lines. Results can be held in storage and combined so a read result can be transmitted as one group. For instance, a user can ask to view a document; many lines are read to disclose document contents to the user. As memory lines are read, they are held in storage and combined with other results to produce a singular document for the user.

A check can take place to determine if other lines are to be scanned 1114. If other reads are to take place, then the methodology 1100 can return to event 1108 to perform other reads. If reads are complete, then the methodology 1100 can continue. It is to be appreciated that multiple reads can take place at one and/or event 1114 can return to other actions in the methodology 1110.

Results of the read can be transferred to another location 1116. The transfer can take wirelessly, through hardwired manners, in an encrypted state, etc. An intended destination of the transmission can be the auxiliary device, another location of the flash memory device, a supplemental location, etc. Multiple transfers can take place, such as to internal flash memory storage and to the auxiliary location.

Figure 12:
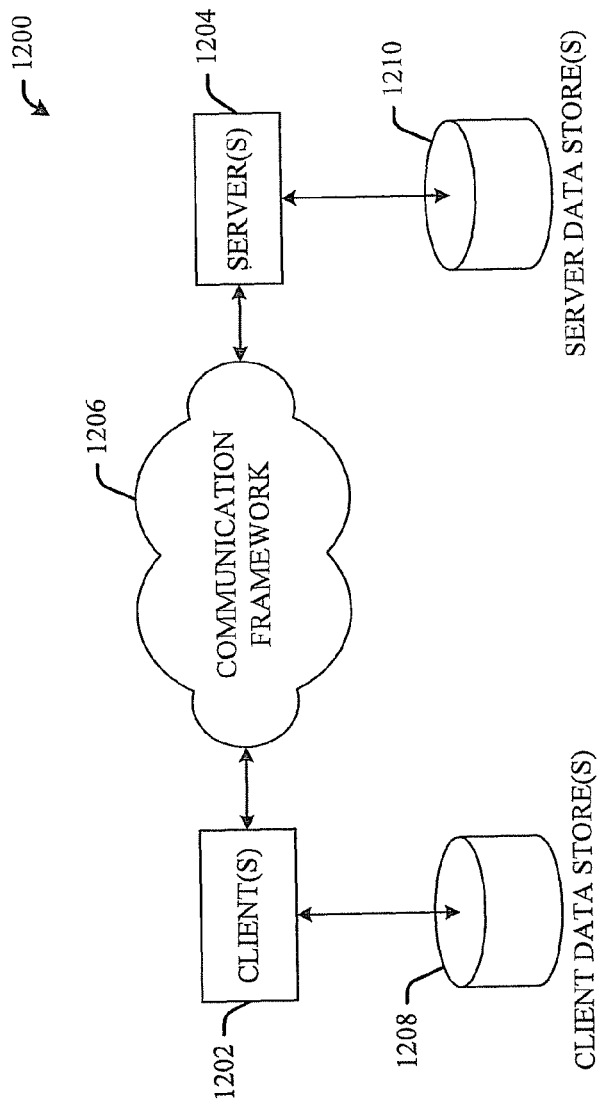
FIG. 12 illustrates an example of a schematic block diagram of a computing environment in accordance with an aspect of the disclosed innovation.
Figure 13:
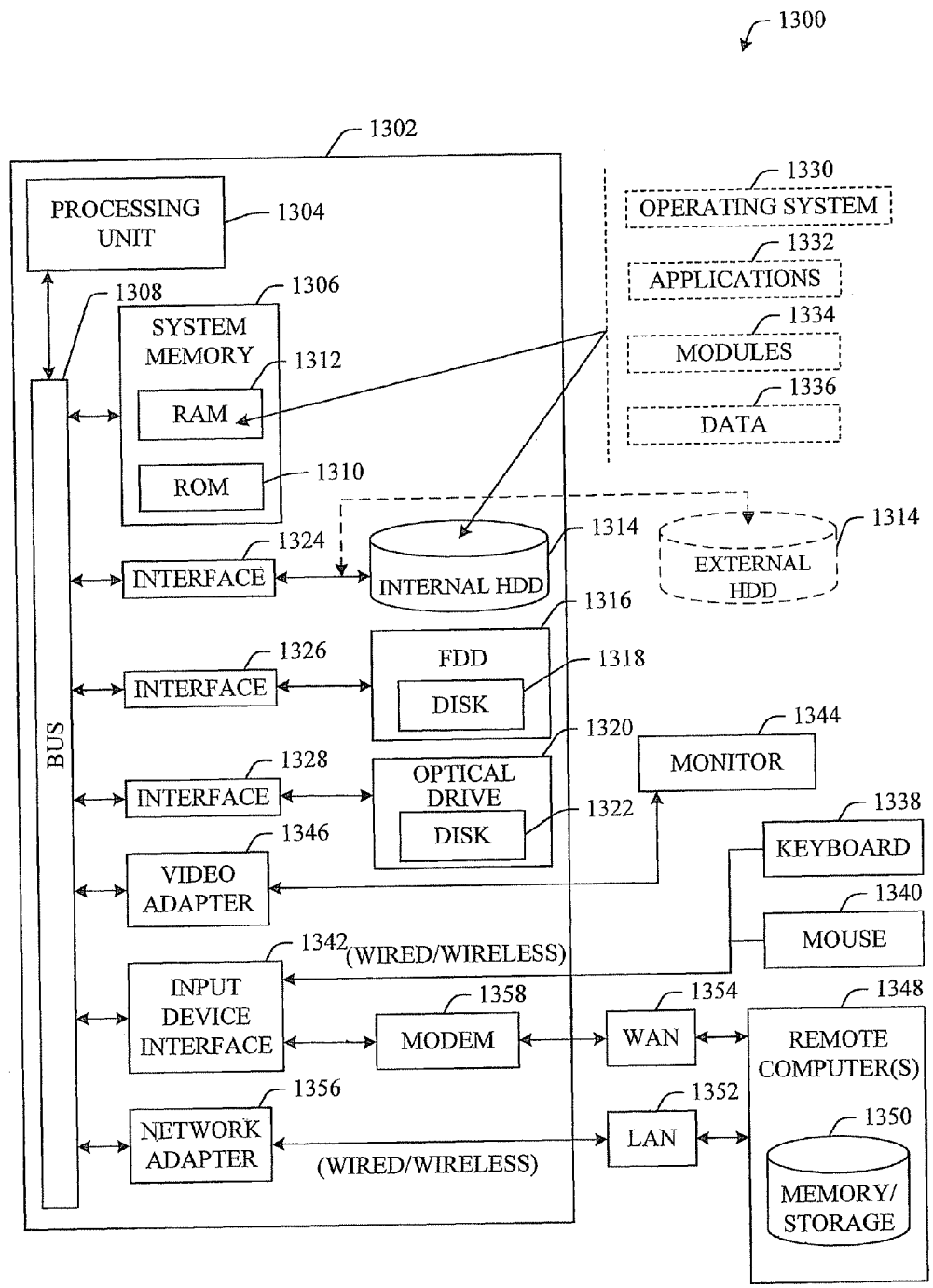
FIG. 13 illustrates an example of a block diagram of a computer operable to execute the disclosed architecture in accordance with an aspect of the disclosed innovation.

In order to provide a context for the various aspects of the disclosed subject matter, FIGS. 12 and 13 as well as the following discussion are intended to provide a brief, general description of a suitable environment in which the various aspects of the disclosed subject matter can be implemented. While the subject matter has been described above in the general context of computer-executable instructions of a program that runs on one or more computers, those skilled in the art will recognize that the subject matter described herein also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor, multiprocessor or multi-core processor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects can also be practiced in distributed computing environments where tasks are performed by remote processing devices that are linked through a communications network. However, some, if not all aspects of the claimed subject matter can be practiced on stand-alone computers. In a distributed computing environment, program modules can be located in both local and remote memory storage devices.

Referring now to FIG. 12, there is illustrated a schematic block diagram of a computing environment 1200 in accordance with the disclosure. The system 1200 includes one or more client(s) 1202. The client(s) 1202 can be hardware and/or software (e.g., threads, processes, computing devices). The client(s) 1202 can house cookie(s) and/or associated contextual information by employing the specification, for example.

The system 1200 also includes one or more server(s) 1204. The server(s) 1204 can also be hardware and/or software (e.g., threads, processes, computing devices). The servers 1204 can house threads to perform transformations by employing the specification, for example. One possible communication between a client 1202 and a server 1204 can be in the form of a data packet adapted to be transmitted between two or more computer processes. The data packet can include a cookie and/or associated contextual information, for example. The system 1200 includes a communication framework 1206 (e.g., a global communication network such as the Internet) that can be employed to facilitate communications between the client(s) 1202 and the server(s) 1204.

Communications can be facilitated via a wired (including optical fiber) and/or wireless technology. The client(s) 1202 are operatively connected to one or more client data store(s) 1208 that can be employed to store information local to the client(s) 1202 (e.g., cookie(s) and/or associated contextual information). Similarly, the server(s) 1204 are operatively connected to one or more server data store(s) 1210 that can be employed to store information local to the servers 1204.

Referring now to FIG. 13, there is illustrated a block diagram of a computer operable to execute the disclosed architecture. In order to provide additional context for various aspects of the disclosure, FIG. 13 and the following discussion are intended to provide a brief, general description of a suitable computing environment 1300 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the specification can also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 13, the example environment 1300 for implementing various aspects of the specification includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes read-only memory (ROM) 1310 and random access memory (RAM) 1312. A basic input/output system (BIOS) is stored in a non-volatile memory 1310 such as ROM, EPROM, EEPROM, which BIOS contains the basic routines that help to transfer information between elements within the computer 1302, such as during start-up. The RAM 1312 can also include a high-speed RAM such as static RAM for caching data.

The computer 1302 further includes an internal hard disk drive (HDD) 1314 (e.g., EIDE, SATA), which internal hard disk drive 1314 can also be configured for external use in a suitable chassis (not shown), a magnetic floppy disk drive (FDD) 1316, (e.g., to read from or write to a removable diskette 1318) and an optical disk drive 1320, (e.g., reading a CD-ROM disk 1322 or, to read from or write to other high capacity optical media such as the DVD). The hard disk drive 1314, magnetic disk drive 1316 and optical disk drive 1320 can be connected to the system bus 1308 by a hard disk drive interface 1324, a magnetic disk drive interface 1326 and an optical drive interface 1328, respectively. The interface 1324 for external drive implementations includes at least one or both of Universal Serial Bus (USB) and IEEE 1394 interface technologies. Other external drive connection technologies are within contemplation of the disclosure.

The drives and their associated computer-readable media provide nonvolatile storage of data, data structures, computer-executable instructions, and so forth. For the computer 1302, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, can also be used in the example operating environment, and further, that any such media can contain computer-executable instructions for performing the methods of the specification.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. It is appreciated that the specification can be implemented with various commercially available operating systems or combinations of operating systems.

A user can enter commands and information into the computer 1302 through one or more wired/wireless input devices, e.g., a keyboard 1338 and a pointing device, such as a mouse 1340. Other input devices (not shown) can include a microphone, an IR remote control, a joystick, a game pad, a stylus pen, touch screen, or the like. These and other input devices are often connected to the processing unit 1304 through an input device interface 1342 that is coupled to the system bus 1308, but can be connected by other interfaces, such as a parallel port, an IEEE 1394 serial port, a game port, a USB port, an IR interface, etc.

A monitor 1344 or other type of display device is also connected to the system bus 1308 via an interface, such as a video adapter 1346. In addition to the monitor 1344, a computer typically includes other peripheral output devices (not shown), such as speakers, printers, etc.

The computer 1302 can operate in a networked environment using logical connections via wired and/or wireless communications to one or more remote computers, such as a remote computer(s) 1348. The remote computer(s) 1348 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1350 is illustrated. The logical connections depicted include wired/wireless connectivity to a local area network (LAN) 1352 and/or larger networks, e.g., a wide area network (WAN) 1354. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 is connected to the local network 1352 through a wired and/or wireless communication network interface or adapter 1356. The adapter 1356 can facilitate wired or wireless communication to the LAN 1352, which can also include a wireless access point disposed thereon for communicating with the wireless adapter 1356.

When used in a WAN networking environment, the computer 1302 can include a modem 1358, or is connected to a communications server on the WAN 1354, or has other means for establishing communications over the WAN 1354, such as by way of the Internet. The modem 1358, which can be internal or external and a wired or wireless device, is connected to the system bus 1308 via the serial port interface 1342. In a networked environment, program modules depicted relative to the computer 1302, or portions thereof, can be stored in the remote memory/storage device 1350. It will be appreciated that the network connections shown are example and other means of establishing a communications link between the computers can be used.

The computer 1302 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5

GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

As used in this application, the terms "component," "module," "system", "interface", or the like are generally intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a controller and the controller can be a component. One or more components can reside within a process and/or thread of execution and a component can be localized on one computer and/or distributed between two or more computers. As another example, an interface can include I/O components as well as associated processor, application, and/or API components.

Furthermore, the claimed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to disclose concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

For purposes of simplicity of explanation, methodologies that can be implemented in accordance with the disclosed subject matter were shown and described as a series of blocks. However, it is to be understood and appreciated that the claimed subject matter is not limited by the order of the blocks, as some blocks can occur in different orders and/or concurrently with other blocks from what is depicted and described herein. Moreover, not all illustrated blocks can be required to implement the methodologies described hereinafter. Additionally, it should be further appreciated that the methodologies disclosed throughout this specification are capable of being stored on an article of manufacture to facilitate transporting and transferring such methodologies to computers. The term article of manufacture, as used, is intended to encompass a computer program accessible from any computer-readable device, carrier, or media.

Operation of the disclosed innovation goes against market trends and general thought in the industry. Conventional industry thought attempts to apply an accurate initial voltage as opposed to pre-charging the memory line, thus improving the cascade circuit. It would not be obvious to combine the overshoot elimination (e.g., partial elimination) with the undershoot elimination (e.g., partial elimination) or to use circuitry in addition to the cascade circuit. Due to sensitivity of circuitry, stressing both overshoot and undershoot can cause a relatively high risk to damaging circuitry. Adding additional circuitry not only is more expensive, but adds another element that can fail in a flash memory device that is classically difficult if not impossible to repair. For instance, a failure in one portion of a flash memory device (e.g., a pre-charge circuit) can cause irreparable harm to other portions—a resistor failure can allow damaging current to reach other flash memory device portions. An unexpected result is produced through practicing the innovation such that fast read times can be achieved with minimal risk to flash memory device durability.

What has been described above includes examples of the disclosure. It is, of course, not possible to describe every conceivable combination of components or methodologies for purposes of describing the disclosure, but one of ordinary skill in the art can recognize that many further combinations and permutations of the disclosure are possible. Accordingly, the disclosure is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a control component that is configured to control a resistance value of a variable resistor component to regulate a pulse width of a pre-charge voltage pulse applied to a metal line associated with a cell component within a specified time range based at least in part on temperature associated with the variable resistor component to maintain the pulse width within the specified time range to control a pre-charge voltage level applied to the metal line, wherein the control component is further configured to apply the pre-charge voltage pulse to the metal line to facilitate reducing an amount of time utilized to read data stored in the cell component associated with the metal line; and
a leakage component that is configured to govern a pulse height within a specified pulse height range, wherein the pre-charge voltage level is based at least in part on the pulse width and the pulse height.

2. The system of claim 1, the control component is further configured to comprise a variable resistor component, wherein the control component is further configured to adjust a resistance level of the variable resistor component to regulate the pulse width.

3. The system of claim 2, the variable resistor component adjusts the resistance level as a function of temperature in accordance with length of the pulse width, wherein adjustment of the resistance level facilitates control of the pulse width to maintain the pulse width within the specified time range.

4. The system of claim 1, the leakage component is further configured to govern pulse height through removal of voltage from the metal line when the pre-charge voltage level is over maximum voltage level of a specified pre-charge voltage range.

5. The system of claim 1, the pulse width is a function of time and the pulse height is a function of voltage.

6. The system of claim 1, further comprising:
a function component that is configured to produce a voltage that is used as a basis for the pre-charge voltage.

7. The system of claim 1, wherein a control component is further configured to apply the pre-charge voltage to the metal line prior to applying a read voltage to the metal line to read the data stored in the cell component.

8. The system of claim 1, further comprising:
an access component that is configured to read the data associated with the memory line when the pulse width and the pulse height align in an appropriate configuration.

9. A method, comprising:
modifying a resistance value of a variable resistor component to control length of a pulse width of a pre-charge voltage pulse applied to a metal line associated with a cell component as a function of temperature associated with the variable resistor component to maintain the pulse width within a specified range of time to control a pre-charge voltage level applied to the metal line; and
applying the pre-charge voltage pulse to the metal line to facilitate reducing an amount of time utilized to read data stored in the cell component associated with the metal line.

10. The method of claim 9, further comprising:
applying the pre-charge voltage to the metal line prior to applying a read voltage to the metal line to read the data stored in the cell component.

11. The method of claim 9, further comprising:
monitoring the pre-charge voltage level applied to the metal line.

12. The method of claim 9, further comprising:
reading data stored in the cell component associated with the metal line when the pre-charge voltage level is within the specified range.

13. The method of claim 9, further comprising:
determining a data value associated with the cell component.

14. The method of claim 9, further comprising:
transmitting a data value associated with the cell component to an auxiliary location.

15. A system, comprising:
means for modifying a resistance value of a variable resistor component to control length of a pulse width of a pre-charge voltage pulse applied to a metal line associated with a cell component as a function of temperature associated with the variable resistor component to maintain the pulse width within a specified range of time to control a pre-charge voltage level applied to the metal line; and
means for applying the pre-charge voltage pulse to the metal line to facilitate reducing an amount of time utilized to read data stored in the cell component associated with the metal line.

16. The system of claim 15, further comprising:
means for controlling the pre-charge voltage level to maintain the pre-charge voltage level within a specified voltage range to reduce voltage undershoot and voltage overshoot of the specified voltage range.

17. The system of claim 15, further comprising:
means for monitoring the pre-charge voltage level of a pre-charge voltage applied to the metal line.

18. The system of claim 15, further comprising:
means for activating a circuit to read data associated with the metal line when the pre-charge voltage level is within the specified range.

19. The system of claim 15, further comprising:
means for determining a data value of the cell component associated with the metal line.

20. The system of claim 15, further comprising:
means for transmitting a data value associated with the cell component to an auxiliary location.

\* \* \* \* \*